United States Patent
Norman

(10) Patent No.: US 8,064,238 B2
(45) Date of Patent: Nov. 22, 2011

(54) SYSTEM USING NON-VOLATILE RESISTIVITY-SENSITIVE MEMORY FOR EMULATION OF EMBEDDED FLASH MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 12/924,821

(22) Filed: Oct. 5, 2010

(65) Prior Publication Data
US 2011/0026291 A1    Feb. 3, 2011

Related U.S. Application Data

(63) Continuation of application No. 12/315,445, filed on Dec. 3, 2008, now Pat. No. 7,808,809, which is a continuation of application No. 11/975,275, filed on Oct. 17, 2007, now Pat. No. 7,593,284.

(51) Int. Cl.
*G11C 5/06* (2006.01)
(52) U.S. Cl. ............... 365/63; 365/185.18; 365/185.29
(58) Field of Classification Search ............... 365/63, 365/230.03, 185.18, 185.29
See application file for complete search history.

(56) References Cited

U.S. PATENT DOCUMENTS

| | | | | |
|---|---|---|---|---|
| 3,648,254 A | * | 3/1972 | Beausoleil | 365/49.17 |
| 6,191,614 B1 | * | 2/2001 | Schultz et al. | 326/41 |
| 6,429,682 B1 | * | 8/2002 | Schultz et al. | 326/41 |

* cited by examiner

*Primary Examiner* — Son Dinh

(57) ABSTRACT

Interface circuitry in communication with at least one non-volatile resistivity-sensitive memory is disclosed. The memory includes a plurality of non-volatile memory elements that may have two-terminals, are operative to store data as a plurality of conductivity profiles that can be determined by applying a read voltage across the memory element, and retain stored data in the absence of power. A plurality of the memory elements can be arranged in a cross-point array configuration. The interface circuitry electrically communicates with a system configured for memory types, such as DRAM, SRAM, and FLASH, for example, and is operative to communicate with the non-volatile resistivity-sensitive memory to emulate one or more of those memory types. The interface circuitry can be fabricated in a logic plane on a substrate with at least one non-volatile resistivity-sensitive memory vertically positioned over the logic plane. The non-volatile resistivity-sensitive memories may be vertically stacked upon one another.

23 Claims, 10 Drawing Sheets

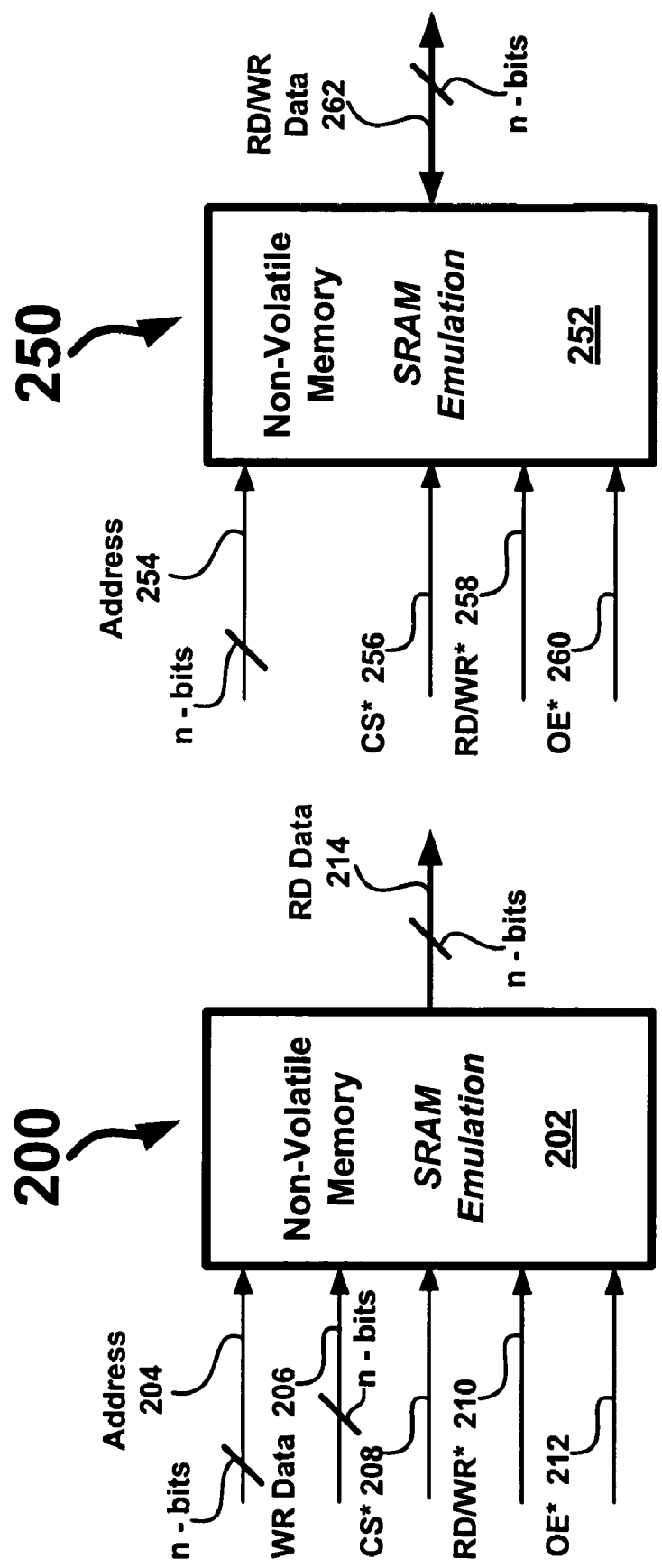

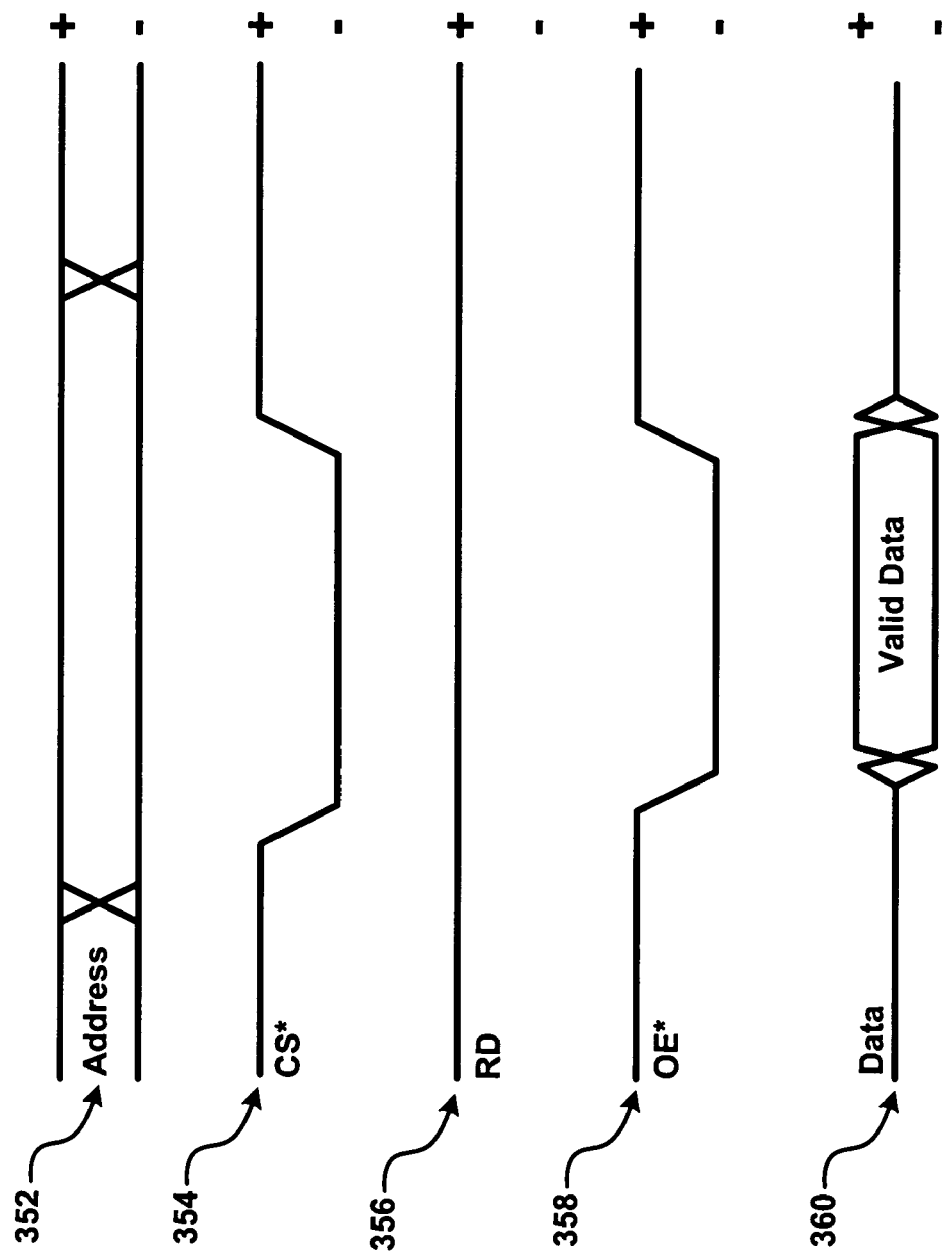

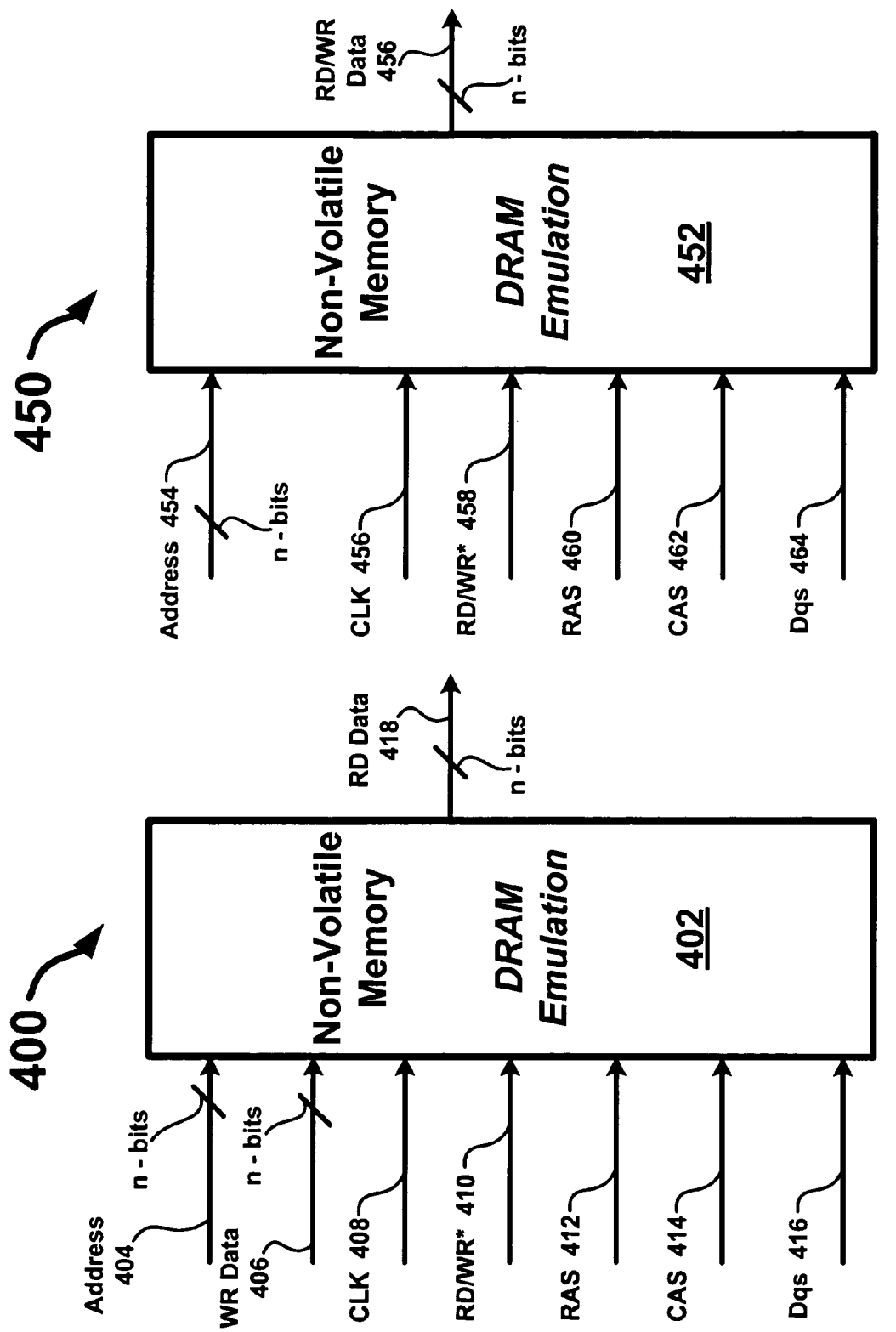

SYSTEM USING NON-VOLATILE RESISTIVITY-SENSITIVE MEMORY FOR EMULATION OF EMBEDDED FLASH MEMORY

FIELD OF THE INVENTION

The present invention relates to electronic systems. More specifically, the present invention relates to transient storage device emulation using non-volatile memory.

BACKGROUND

Random access memories (RAM) are memories that may be used to store data for electronic systems. A volatile memory is a memory that loses its contents when power is removed from the memory. Therefore, volatile RAM retains its contents only when a device including the memory is powered on. As a result, when a device is powered on, data may be copied from a non-volatile memory source (e.g., a hard drive) to the volatile RAM in order to use the RAM.

There are several varieties of volatile RAM. Two of the most common types of memory available are static random access memory (SRAM) and dynamic random access memory (DRAM). SRAM includes several transistors arranged as a flip-flop to store each bit of memory. DRAM includes a transistor and a capacitor used to store each bit of memory. Since capacitors leak charge, a DRAM is constantly refreshed (i.e., the capacitors are recharged) to retain data stored in the DRAM. DRAM has fewer components and is less complex, and is therefore less expensive than SRAM. On the other hand, SRAM is faster than DRAM and does not require a refresh cycle. In a system incorporating DRAM, the refresh operation (e.g., RAS and CAS) place a burden on system resources such as a CPU or a memory controller that coordinates data operations to the DRAM.

FLASH memory is a type of non-volatile memory in that it retains stored data when power is removed from the memory. FLASH memory may therefore be useful in devices that require fast data access upon system booting. However, FLASH memory typically uses a complex logic interface, including state machines and other logic devices, to read and program the memory. FLASH memory may also be slower than DRAM or SRAM, because FLASH memory includes the complex logic interface and because FLASH memory is programmed in blocks of bits. For example, non-volatile RAM (e.g., FLASH memory) and non-volatile memory cards (e.g., FLASH memory cards such as a SD™ card) utilize an erase operation prior to writing. That is, non-volatile FLASH memory is not able to perform consecutive, or back to back, write operations. Data must be erased prior to the next write. A block of data may be erased at one time using one action, or one "flash." It is from this erase process that the name "FLASH memory" was drawn. The erase process also causes non-volatile RAM and non-volatile memory cards to be too slow for widespread use, but useful in certain applications (e.g., as a portable data storage option).

Many existing devices use SRAM, DRAM, FLASH memory, FLASH memory cards, other types of RAM, and various other memory technologies. Those devices are subject to the limitations of the aforementioned memory types.

There are continuing efforts to improve memory technology in electronic systems.

BRIEF DESCRIPTION OF THE DRAWINGS

The present invention will be readily understood by the following detailed description in conjunction with the accompanying drawings, and like reference numerals designate like structural elements:

FIG. 2A depicts an exemplary memory interface for emulating SRAM;

FIG. 2B depicts another exemplary memory interface for emulating SRAM;

FIG. 3B depicts an exemplary read cycle timing diagram for memory interface such as those depicted in FIGS. 2A and 2B;

FIG. 4A depicts an exemplary memory interface for emulating a DRAM;

FIG. 4B depicts another exemplary memory interface for emulating DRAM;

Figure 1A:
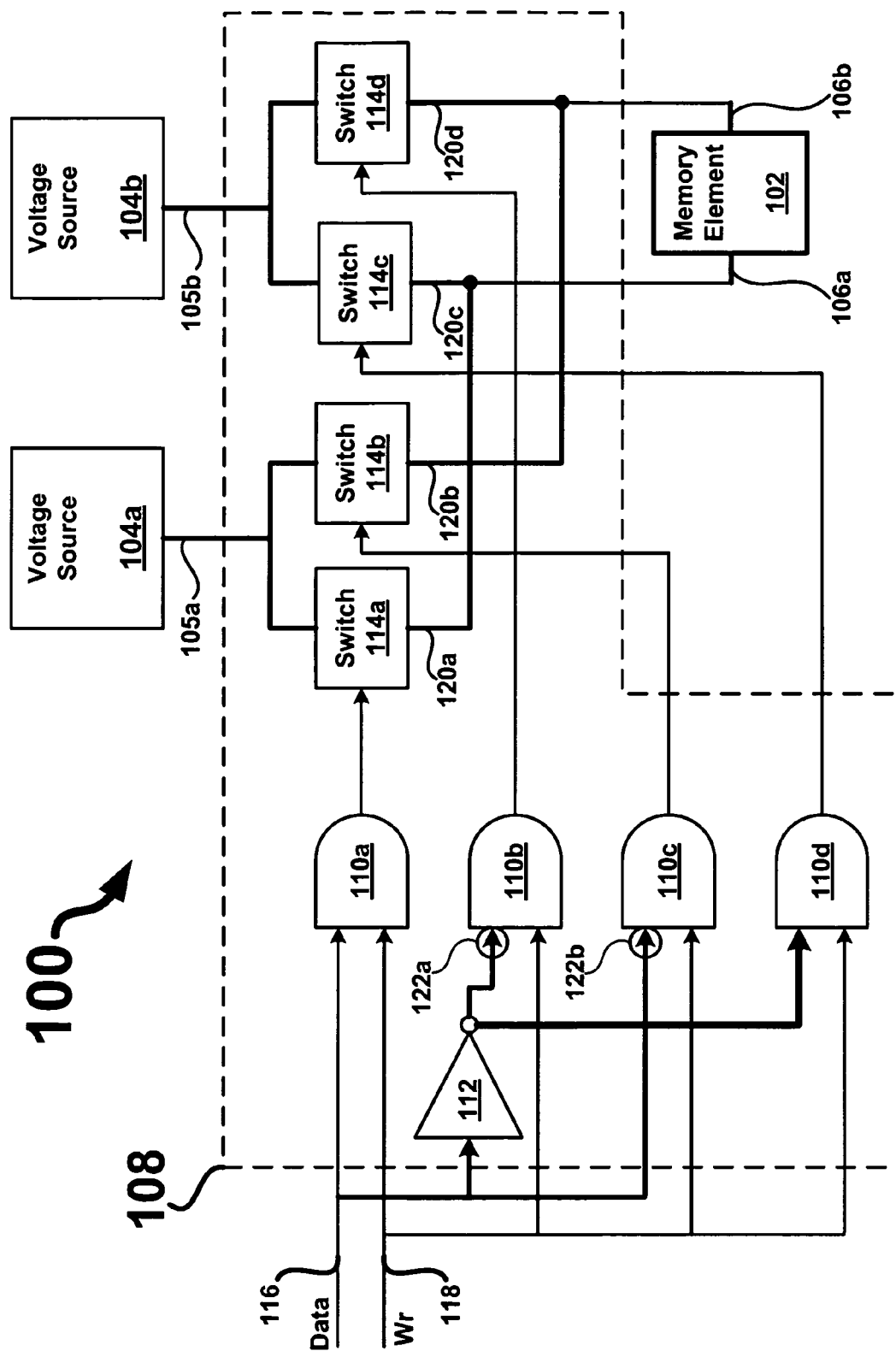
FIG. 1A depicts an exemplary write circuitry for emulating at least one memory type.

Although the previous Drawings depict various examples of the invention, the invention is not limited by the depicted examples. Furthermore, the depictions are not necessarily to scale.

DETAILED DESCRIPTION

A detailed description of one or more examples is provided below along with accompanying figures. The detailed description is provided in connection with such examples, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described examples may be implemented according to the claims without some or all of these specific details. For the purpose of clarity, technical material that is known in the technical fields related to the examples has not been described in detail to avoid unnecessarily obscuring the description.

According to various examples, various memory interfaces are described herein. The memory interfaces may be used, for example, to use a non-volatile resistivity-sensitive memory element with devices that include or use existing memory technology (e.g., DRAM, SRAM, and FLASH). A memory interface may receive an address and data from a host configured to operate a SRAM and/or a DRAM, for example. The memory interface can then use the address and data to perform a data operation (e.g., read or write) on the non-volatile resistivity-sensitive memory element. The interface is operative to enable the non-volatile resistivity-sensitive memory to emulate one or more memory types including but not limited to DRAM, SRAM, FLASH, or any combination of those memory types, for example. Various other signals may be received and used according to various other examples.

Memory Technology

Non-volatile memory technologies may be used with memory systems to develop high density, low cost, and fast access memories. Access may refer to accessing and performing data operations (e.g., read, write, erase) on a memory or memory array. Preferably, a non-volatile, cross-point, high density memory array that uses direct memory addressing, has a fast read/write capability, and uses neither an erase process, nor any added code in the operating system is used to replace one or more of the aforementioned multiple memory types. Examples of non-volatile memory arrays may include two-terminal or three-terminal cross-point memory arrays configured as a single layer array or as multiple layer vertically-stacked arrays. An exemplary non-volatile two-terminal cross-point memory array is described in U.S. patent application Ser. No. 11/095,026, filed Mar. 30, 2005, and titled "Memory Using Mixed Valence Conductive Oxides," hereby incorporated by reference in its entirety and for all purposes. The application describes non-volatile third dimension memory cells that can be arranged in a cross-point array and describes a two terminal memory element that changes conductivity when exposed to an appropriate voltage drop across the two terminals. The memory element includes both a mixed ionic electronic conductor and a layer of material that has the bulk properties of an electrolytic tunnel barrier (i.e., properties of an electronic insulator and an ionic conductor). A voltage drop across the electrolytic tunnel barrier causes an electrical field within the mixed ionic electronic conductor that is strong enough to move oxygen ($O_2$) ions out of the mixed ionic electronic conductor and into the electrolytic tunnel barrier. Oxygen depletion causes the mixed ionic electronic conductor to change its conductivity. Both the electrolytic tunnel barrier and the mixed ionic electronic conductor do not need to operate in a silicon substrate, and, therefore, can be fabricated above circuitry being used for other purposes (e.g., selection circuitry, sense amps, and address decoders). A memory is "third dimension memory" when it is fabricated above other circuitry components, the components usually including a silicon substrate, polysilicon layers and, typically, metallization layers, for example.

The two-terminal memory elements can be arranged in a cross-point array such that one terminal is electrically coupled with an x-direction line and the other terminal is electrically coupled with a y-direction line. A stacked cross-point array consists of multiple cross-point arrays vertically stacked upon one another, sometimes sharing x-direction and y-direction lines between layers, and sometimes having isolated lines. When a first write voltage $V_{W1}$ is applied across the memory element, (typically by applying ½ $V_{W1}$ to the x-direction line and ½-$V_{W1}$ to the y-direction line) it switches to a low resistive state. When a second write voltage $V_{W2}$ is applied across the memory element, (typically by applying ½ $V_{W2}$ to the x-direction line and ½-$V_{W2}$ to the y-direction line) it switches to a high resistive state. Typically, memory elements using electrolytic tunnel barriers and mixed ionic electronic conductors require $V_{W1}$ to be opposite in polarity from $V_{W2}$. Typically, a magnitude of the voltage applied across the memory element for data operations (e.g., read or write) is less than approximately 10 volts. More preferably, the magnitude of the voltage applied across the memory element is less than approximately 7 volts.

In applications requiring high density data storage in a small footprint memory device, two-terminal cross-point memory arrays are preferable over three-terminal cross-point memory arrays because the extra area required to route the interconnect lines that electrically couple with the third terminal in the three-terminal cross-point memory array reduces areal density and increases die size and device footprint. Therefore, given the same die size, a two-terminal cross-point memory array will have a higher data storage density than the three-terminal cross-point memory array. A device can incorporate one or more of the non-volatile cross-point memory arrays to replace some or all of the aforementioned multiple memory types (e.g., DRAM, SRAM, FLASH, FLASH memory cards, ROM, and EEPROM). The memory array(s) can emulate multiple memory types and may be used to replace any one or combination of those memory types. The memory array(s) may be randomly accessed by a system interfaced to the memory array(s).

Fast accesses for data operations may be achieved by using page buffers to allow multiple data operations to be performed substantially simultaneously (i.e., buffering data from a read access and for a write access). Further, various examples of data packet formats and data communication protocols may be used to indicate how data from different data operations (e.g., read or write) may be aligned to allow fast accesses to a memory array.

The memory technology described above comprises a resistivity-sensitive memory element. Preferably, the resistivity-sensitive memory element is a two-terminal memory element. A resistivity-sensitive memory detects changes in conductivity in the memory element as a magnitude of a read current that flows through the memory element when a read voltage is applied across its terminals. The magnitude of the read current is indicative of either a logic '0' or a logic '1'. The memory technology is also non-volatile. In other words, when power is removed from the memory, stored data is retained in the absence of power. The memory technology requires no refresh, which improves performance over other memory technologies. The memory technology also requires no erase for writes and does not require an operating system (OS), improving performance. Furthermore, the memory arrays may be directly addressed. Additionally, the memory elements are physically smaller than many other conventional memory technologies, thereby increasing densities leading to smaller sizes and reduced power consumption. The memory arrays can also be vertically stacked on top off one another in a vertical manner for increased density. Active circuitry for performing data operations to the memory array can be fabricated on a substrate (e.g., a silicon wafer) and electrically coupled with one or more of the memory arrays that are fabricated over the substrate and its active circuitry. For example, an interconnect structure can be used to electrically couple the memory arrays with circuitry in the substrate. In a vertically stacked configuration, where a plurality of the memory arrays are positioned over the substrate and are vertically staked upon one another, the interconnect structure can be routed from the active circuitry to each layer or level of memory in the stacked configuration.

Memory Interface

Turning now to FIG. 1A, an exemplary write circuitry 100 is depicted. The write circuitry 100 may be used to emulate the function of various memory types, such as a FLASH, FLASH memory cards, read only memory (ROM), and various random access memories (RAM) including SRAM and DRAM. The write circuitry 100 may be used to program a memory element 102, which may be, for example, a two-terminal non-volatile rewriteable memory element as was described above. Although one memory element 102 is depicted, a memory may include plurality of memory elements, and further may use an interface configured to address and access multiple memory elements (such as the interfaces depicted in FIGS. 2A, 2B, 4A, and 4B). As was described above, the plurality of memory elements may be configured into a cross-point array.

The write circuitry 100 and other interface logic described herein may be used to perform memory emulation of one or more memory types. Memory emulation allows a memory including memory elements 102 to be used in place of another type of memory. For example, the write circuitry 100 may be configured to allow a resistivity-sensitive memory to be used in place of a DRAM, a SRAM, FLASH, or a combination of those memory types. In some examples, the resistivity-memory may be incorporated into a device that would otherwise use another type of memory. In this way, the resistivity-sensitive memory may be used to emulate memory types in existing electronic devices and systems. Moreover, the benefits of the memory technology may be applied to extant and future electrical devices and systems.

The memory element 102 may be programmed by applying voltages from voltage sources 104a and 104b to terminals 106a and 106b of the memory element 102. The voltage sources 104a and 104b may be of opposite polarity to each other. For example, the voltage source 104a may output +3V, while the voltage source 104b outputs −3V. As another example, to write a logic '1' (i.e., a high) to the memory element 102, the voltage from the voltage source 104a (e.g., +3V) is applied at the terminal 106a and the voltage from the voltage source 104b (e.g., −3V) is applied at the terminal 106b. Conversely, to write a logic '0' (e.g., a low) the voltage from the voltage source 104a is applied at the terminal 106b, and the voltage from the voltage source 104b is applied to the terminal 106a.

The writing of data to the memory element 102 is controlled by a logic 108 that includes several logic gates 110a, 110b, 110c, and 110d, an inverter 112, and several switches 114a, 114b, 114c, and 114d. Switches 114a and 114b are electrically coupled 105a with the voltage source 104a and switches 114c and 114d are electrically coupled 105b with the voltage source 104b. The logic gates 110a, 110b, 110c, and 110d and inverter 112 receive input in the form of a signal (Data) on a data pin 116, and a write enable signal (Wr) on a write enable pin 118. The logic gates 110a, 110b, 110c, and 110d, as depicted in FIG. 1A are AND gates, which combine the incoming signals from the data pin 116 and the write enable pin 118 to determine which of the switches 114a, 114b, 114c, 114d to activate. The switches 114a, 114b, 114c, and 114d may control voltage rails 120a, 120b, 120c, and 120d to determine which voltage is activated and applied to which of the terminals 106a and 106b of the memory element 102, and thereby which value of data (e.g., logic '0' or '1') is to be written to the memory element 102. For example, if switches 114a and 114d are closed and switches 114b and 114c are open, then +3V from the voltage source 104a is applied to the terminal 106a, −3V from the voltage source 104b is applied to the terminal 106b, and a logic '1' is written to the memory element 102. In contrast, if switches 114b and 114c are closed and switches 114a and 114d are open, then −3V from the voltage source 104b is applied to the terminal 106a, +3V from the voltage source 104a is applied to the terminal 106b, and a logic '0' is written to the memory element 102. Therefore, in the above example, when the Data=1, switches 114a and 114d are closed and switches 114b and 114c are open, and when Data=0, switches 114a and 114d are open and switches 114b and 114c are closed.

According to various examples, n- and p-channel transistors may be used with the write circuitry 100, and on/off polarities may be adjusted accordingly. Also, transmission gates may be used, so true and compliment gating may be used with the write circuitry 100. It is also understood the writing may be performed using all positive voltages or all negative voltages. For example, a voltage delta of 6 may be used to transition the conductivity of the memory element 102 from one state to the other state (e.g., from 0 to 1 or 1 to 0). In FIG. 1A this may be done by using +3V and −3V across the memory element 102. If positive voltages are used different values could be used, for example 0V and 6V or 1V and 7V. The same can be done with negative voltages. The positive and negative voltages described herein may eliminate the need for charge pumps, as voltage sources configured to supply +/−3 volts are readily available in most designs. Implementing switching voltages may be done with different type transistors, which may use different gate (on/off) signaling. To keep the description simple, gates are shown as being on with a positive enable and off for negative enables. The enable levels may need to be logically adjusted to meet the design approach.

For example, if a host system writes a 1, the data pin 116 receives a 1, and the write enable pin 118 receives a 1 (to indicate that a write operation is commanded), causing the logic gate 110a to output a 1 (since it is an AND gate), closing the switch 114a. The inverter 112 presents a 0 to an inverted input 122a of the logic gate 110b, which presents a 1 to the logic gate 110b, along with the high write enable signal. As a result, the logic gate 110b outputs a 1, closing the switch 114d. The logic gate 110c outputs a 0, since an inverted input 122b inputs a 0 to the logic gate 110c. The switch 114b is therefore open. The logic gate 110d receives an output of the inverter 112, and is therefore a 0, which results in a 0 being outputted from the logic gate 110d. The switch 114c is therefore open.

The switches 114a and 114d are closed when the data to be written is a 1, and when the write enable pin 118 is high. As a result, the memory element 102 receives the voltage of the voltage source 104a (e.g., +3V) at the terminal 106a, and the voltage of the voltage source 104b (e.g., −3V) at the terminal 106b. According to the above example, the result is that the memory element 102 is written with a logic '1'.

To program the memory element 102 with a 0, the data pin 116 receives a 0, while the write enable pin 118 receives a 1. The output of the logic gates 110a and 110b then becomes 0, opening the switches 114a and 114d. The output of the logic gates 110c and 110d becomes 1, closing the switches 114b and 114c. The result is that the memory element 102 receives the voltage of the voltage source 104a (e.g., +3V) at the terminal 106b, and the voltage of the voltage source 104b (e.g., −3V) at the terminal 106a, and a 0 is written to the memory element 102.

The write circuitry 100 may be used to program any type of memory element, for example a non-volatile resistivity-sensitive memory element using the memory technology described above. The write circuitry 100 may be a base circuit that may be further expanded (e.g., combined with other logic) and used as an interface between a memory element of the memory technology and a FLASH memory interface, a SRAM interface, a DRAM interface, or any other type of memory interface. For example, the write circuitry 100 may receive data and a write enable signals from a flash memory interface. The write circuitry 100 may further be used in place of a state machine of a FLASH memory, for example. Any memory that receives signals including but not limited to a write enable signal and a data signal, for example, may be used with the write circuitry 100.

Figure 1B:
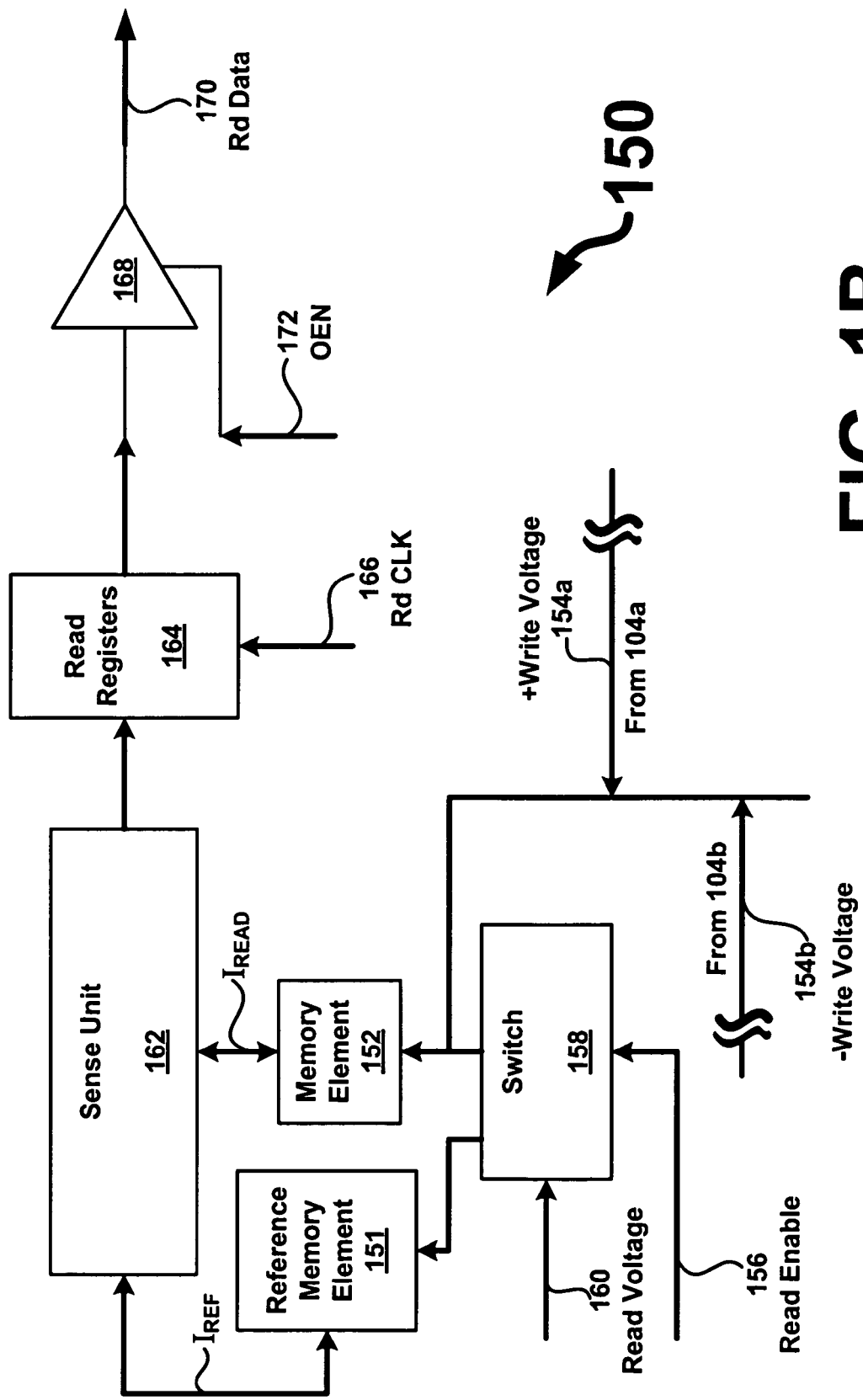
FIG. 1B depicts an exemplary read circuitry for emulating at least one memory type.

FIG. 1B depicts read circuitry 150 that may be used to read resistivity-sensitive memory elements according to various examples. A memory element 152 may be a resistivity-sensitive memory element using the memory technology described above. The read circuitry 150 may be incorporated with the write circuitry 100, for example. A positive write voltage 154a (from the voltage source 104a) and a negative write voltage 154b (from the voltage source 104b) may be used to write data to the memory element 152 during write operations, for example.

A read enable signal may be received over a read enable pin 156. The read enable signal may activate a switch 158 when a read cycle occurs. The switch 158 controls a read voltage 160, which may be applied across the memory element 152 when the read enable signal is active (e.g., high). Upon receiving the read voltage 160, the memory element 152 may generate a read current $I_{READ}$, which may be received by a sensing unit 162. Examples of a sense unit include but are not limited to a sense amp, a comparator, or current mirror. A magnitude of the read current $I_{READ}$ is indicative of the value of data stored in the memory element 152. For example, if a logic '0' has a low conductivity and a logic '1' has a higher conductivity than a logic '0', then the read current $I_{READ}$ will be lowest when the memory element 152 stores a logic '0' and higher when the memory element 152 stores a logic '1'. A comparator or current mirror in the sense unit 162 may compare the read current $I_{READ}$ with a reference current $I_{REF}$, and output the difference into read registers 164. Although registers are depicted, it is understood that the read registers 164 may be any type of memory (e.g., a latch or flip-flop). The reference current $I_{REF}$ may be, for example, a current generated by a reference memory element 151. The reference memory element 151 may have a structure that is substantially identical to that of the memory element 152. During a read operation, the read voltage 160 is also applied across the reference memory element 151 to generate the reference current $I_{REF}$. A current to voltage converter (I/V converter) in the sense unit 162 may be used to convert the read current $I_{READ}$ and the reference current $I_{REF}$ into voltages $V_{READ}$ and $V_{REF}$ respectively that are coupled with a comparator. For example, the comparator can generate an output data signal that is a difference between $V_{READ}$ and $V_{REF}$ and that data signal is the approximate value of the data stored in the memory element 152. The reference memory element 151 may be pre-programmed to store a reference conductivity value that is intermediate between the conductivity values that define a logic '0' and a logic '1'.

The read registers 164 may store the voltage difference between the read current $I_{READ}$ and the reference current $I_{REF}$ (resulting in a logic '1' or logic '0' being stored). The read registers 164 may also receive a read clock 166 to maintain system timing. The read registers 164 outputs the voltage state to a three-state buffer 168, which may translate the voltage difference into one of three memory states. A buffer capable of determining more or fewer states may also be used. The three-state buffer 168 may output an appropriate read data (e.g., a 0, 1 or 3-state), depending on the voltage difference. The three-state buffer 168 may be controlled by an output enable signal (OEN) on pin 170. The OEN pin 170 may receive an OEN signal that may be used to activate the three-state buffer 168 for data output (e.g., to a data bus). A magnitude of the read voltage 160 is less than a magnitude of the write voltage (154a, 154b) so that the read voltage does not disturb or overwrite the data stored in the memory element during a read operation. As one example, if the magnitude of the write voltage is 6V (e.g., 154a=+3V and 154b=−3V), then the magnitude of the read voltage 160 can be 4V applied across the two terminals of the memory element 152 (e.g., +2V on one terminal and −2V on the other terminal). If the reference memory element 151 is used, then the same read voltage 160 is also applied across its terminals; however, the write voltage is not applied across the terminals of the reference memory element 151 so that the reference conductivity value is not disturbed or overwritten.

The read circuitry 150 may be incorporated, with the write circuitry 100 or alone, into various memory interfaces to allow a resistivity-sensitive memory to emulate other memory types. For example, the read circuitry 150 may be incorporated into a memory interface to emulate SRAM or DRAM memories, as is described below in reference to FIGS. 2A, 2B, 3A, 3B, 4A, 4B, 5A, and 5B.

SRAM Emulation Interface

FIGS. 2A and 2B illustrate memory interfaces operative to emulate a SRAM according to various examples. FIG. 2A illustrates a split data interface 200, while FIG. 2B illustrates a shared data interface 250. The interfaces 200 and 250 may be used, for example, to allow a memory including non-volatile resistivity-sensitive memory elements to emulate the functionality of a SRAM in a device or system that uses a SRAM. Therefore, the memory can replace SRAM in the device/system and operate, communicate, and interface transparently to the device/system.

The split data interface 200 includes several pins to read data from and write data to a non-volatile memory 202. The split data interface 200 may interact with a host, for example, to receive or transmit data, addresses, and other signals to and from the host. The non-volatile memory 202 may include one or more memory elements, for example those using the memory technology described above. For example, the memory element may be a non-volatile two-terminal rewriteable resistivity-sensitive memory element. The split data interface 200 may be, for example, an interface to be used with a SRAM. According to an example, the split data interface 200 may instead be used with a resistivity-sensitive memory element. The split data interface 200 may be used, for example, with the write circuitry 100 and the read circuitry 150 to program resistivity sensitive memory elements.

The pins of the split data interface 200 include an address pin 204, a write data pin 206, a chip select pin 208, a read/write pin 210, an output enable pin 212, and a read data pin 214. The split data interface 200 receives write data 206 and outputs read data 214 on separate pins, hence the term "split data." FIGS. 3A and 3B describe the signals and timing for data operations (e.g., read and write access) to the non-volatile memory 202.

The address pin 204 may receive an address. The address may be a location in the non-volatile memory 202 to which data is to be written to or from which data is to be read. One skilled in the art will appreciate that the address pin 204 may be electrically coupled with an address bus and therefore may be n-bits wide (e.g., 8-bits, 16-bits, 32-bits, 64-bits, etc.). Similarly, write data 206 and read data 214 may also be electrically coupled with a bus and may also be n-bits wide. The address may have any format, and may specify a location of a bit (or multiple bits) of memory, for example. The write data pin 206 receives write data to be written to the address if the action is write operation (e.g., RD/WR*=0), while the read data pin 214 outputs read data from the address if the action is a read operation (e.g., RD/WR*=1).

The chip select pin 208 may be used to select the non-volatile memory 202 for access. The chip select pin 208 may be normally be held high, and brought low when access is requested, for example. The read/write pin 210 may be used to select what action is taken. For example, the signal on the read/write pin 210 may be high for a read, and low for a write (the signal may also be low for a read, high for a write). The output enable pin 212 may be used to indicate that the memory 202 is to be configured to output data (e.g., OE*=0 for a read operation).

Turning now to FIG. 2B, the shared data interface 250 also includes several pins for data operations to a non-volatile memory 252. The shared data interface 250 may interact with a host, for example, to receive or transmit data, addresses, and other signals to and from the host. The memory 252 may include one or more memory elements, for example those using the memory technology described above. For example, the memory element may be a non-volatile two-terminal rewriteable resistivity-sensitive memory element. The shared data interface 250 may be, for example, an interface to be used with a SRAM. In this application the shared data interface 250 may instead be used with a resistivity-sensitive memory element.

The pins of the shared data interface 250 include an address pin 254, a chip select pin 256, a read/write pin 258, an output enable pin 260, and a shared read/write data pin 262. The read data is output from the memory 252 and the write data is input into the memory 252 using the same read/write data pin 262, hence the term "shared data interface." The address pin 254 and the read/write data pin 262 may be electrically coupled with a bus and may be n-bits wide.

The address pin 254 receives an address to read data from or write data to the non-volatile memory 252. The chip select pin 256 may be used to select the non-volatile memory 252 for a data operation (e.g., CS*=0). The chip select pin 256 may be normally be held high, and brought low when access is requested, for example. The read/write pin 258 may be used to indicate whether a read or a write operation is to take place. The output enable pin 260 may be used to indicate that the non-volatile memory 252 is to be configured to output data (e.g., OE*=0 for a read operation).

The shared read/write data pin 262 may be used to either receive write data or output read data, depending on the current data operation. For example, the read/write pin 258 may be high to indicate that a read operation is to take place; the shared read/write data pin 262 is then configured to output data.

SRAM Read/Write Timing Diagrams

Figure 3A:
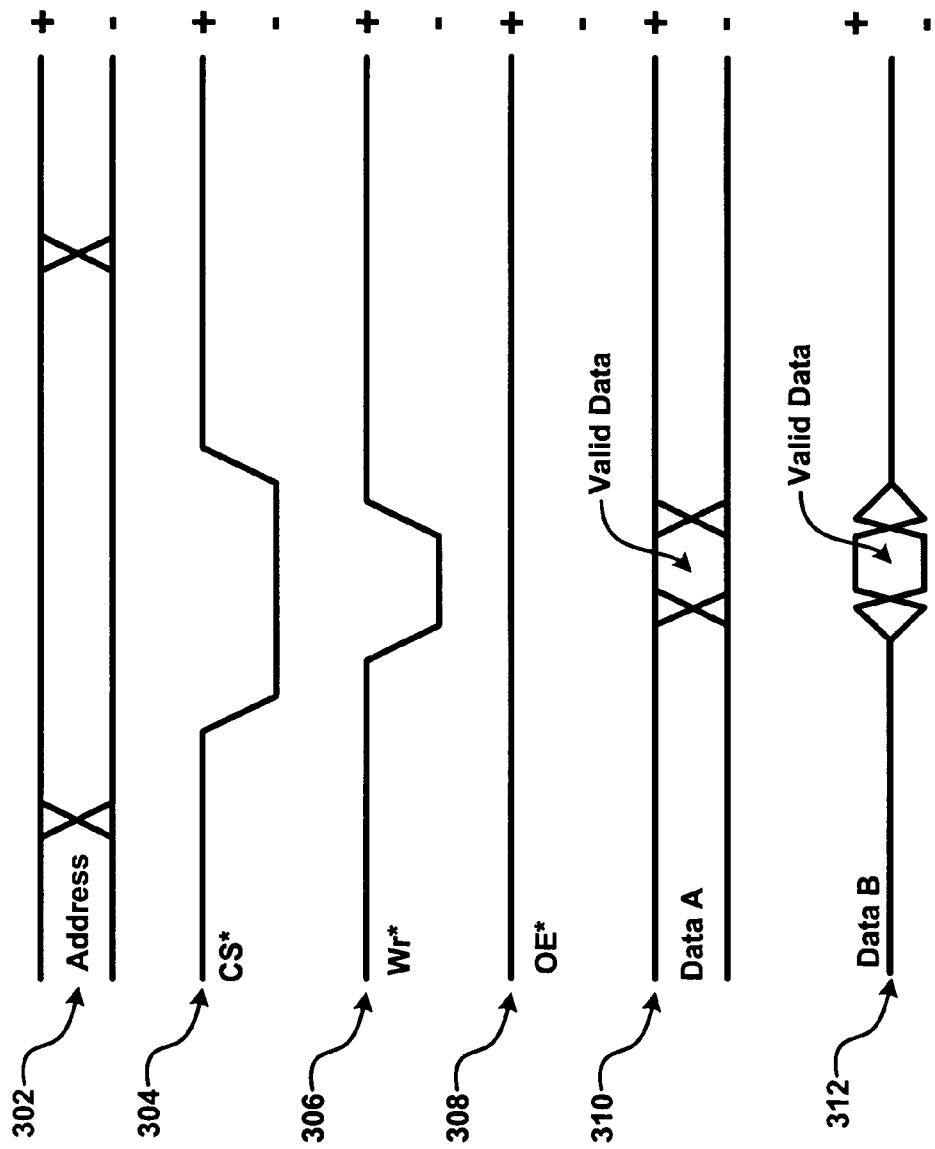
FIG. 3A depicts an exemplary write cycle timing diagram for a memory interface such as those depicted in FIGS. 2A and 2B.

FIGS. 3A and 3B depict timing diagrams for write and read cycles respectively, using a memory interface such as those described above in regards to FIGS. 2A and 2B. FIG. 3A depicts a timing diagram 300 for a write cycle using an interface such as one of the interfaces 200 or 250. FIG. 3B depicts a timing diagram 350 for a read cycle using an interface such as one of the interfaces 200 or 250. The timing diagrams 300 and 350 depict, for example, the signals at the pins 204-214 or 254-262 over time according to various examples. These signals may be used to write data to or read data from a resistivity-sensitive memory element in a non-volatile memory that emulates a SRAM according to various examples.

According to an example, the interfaces 200 and 250 may be configured to perform a write using a cycle approximately as long as a SRAM write cycle. This may allow for emulation where a host may attempt to write to a SRAM using timing that the host would expect for a SRAM.

In FIG. 3A, timing diagram 300 depicts the change in several signals over time. The signals include an address signal 302, a chip select signal 304, a write signal 306, an output enable signal 308, and two data signals 310 and 312.

Accordingly, the various signals may, for each clock signal, run high (e.g., + or 1) or low (e.g., − or 0).

When a write cycle begins, the address signal 302 is transmitted over an address pin such as the address pins 204 or 254. As was described above, the address pins 204 or 254 may be n-bits wide. The address signal 302 may include any signal to specify an address of a memory to be written. According to an example, the address signal 302 may be transmitted at any time during the write cycle as long as the setup time requirements are met.

The write cycle may begin when the chip select signal 304 goes low (e.g., CS*=0) to indicate that the memory has been selected for access. After the chip select signal 304 goes low, the write signal 306 (e.g., RD/WR*=0 on the read/write pin 210 or 258) also goes low to indicate that a write cycle is to begin. The output enable signal 308 is high and remains high during the write cycle because data is not outputted during a memory write operation. In that the cycle is a write cycle, the output enable signal 308 (e.g., OE*=1 on the output enable pin 212 or 260) stays high to indicate that nothing is to be output from the memory.

The data signals 310 and 312 may include any valid data during the write cycle and may be n-bits wide. According to an example, the data signals 310 and 312 may include write data for direct data input and for shared or three-state data input on a memory bus. After the write cycle is completed, the write signal 306 may go high to indicate the end of the write cycle. The chip select signal 304 may then also go high to indicate that the memory is no longer being accessed.

A write operation may be performed using a device having a host configured to operate a SRAM, for example. The host may generate the signals 302-312 and transmit them to one of the interfaces 200 or 250. The interfaces 200 or 250 may then, for example, use the write circuitry 100 to write data to the various individual memory elements being accessed (i.e., those memory elements that are selected by the address).

In FIG. 3B, timing diagram 350 depicts a read cycle over time. The timing diagram 350 includes several signals: an address signal 352; a chip select signal 354; a read signal 356; an output enable signal 358; and a data signal 360. The address signal 352 may be the signal at one of the address pins 204 or 254 and may be n-bits wide. The chip select signal 354 may be the signal at one of the chip select pins 208 or 256. The read signal 356 may be the signal at one of the read/write pins 210 or 258. The output enable signal 358 may the signal at one of the output enable pins 212 or 260. The data signal 360 may be the signal at the read data pin 214 or the read/write data pin 262 and may be n-bits wide.

The address signal 352 may include values that identify an address of the memory to be read. The chip select signal 354 goes low to indicate that the memory is selected to be read from. The read signal 356 stays high to indicate that a read is requested. The output enable signal 358 may go low after the chip select signal 354 goes low to indicate that the memory is to output (e.g., to output read data). The data signal 360 may include any valid data being read from the memory.

A read operation may be performed using a device having a host configured to operate a SRAM, for example. The host may generate the signals 352-360 and transmit them to one of the interfaces 200 or 250. The interfaces 200 or 250 may then, for example, use the read circuitry 150 to read the various individual memory elements being accessed (i.e., those memory elements that are selected by the address).

DRAM Emulation Interface

FIGS. 4A and 4B depict memory interfaces to emulate a DRAM according to various examples. FIG. 4A depicts a split data interface 400, while FIG. 4B depicts a shared data interface 450. The interfaces 400 and 450 are both DRAM emulation interfaces, which include row address select (RAS) and column address select (CAS) pins, as well as a data clock (Dqs) pin and a clock (CLK) pin, all of which may allow a non-volatile resistivity memory to serve in the place of a DRAM in a device/system designed to interface with DRAM. The address, RAS, CAS, and read and/or write data pins may be n-bits wide.

The split data interface 400 interfaces with a non-volatile memory 402, which may include one or more resistivity-sensitive memory elements of the memory technology described above. The split data interface 400 includes an address pin 404, a write data pin 406, a clock pin 408, a read/write select pin 410, a RAS pin 412, a CAS pin 414, a Dqs pin 416, and a read data pin 418. The split data interface 400 is a split data interface since the write data 406 and read data 418 signals are on different pins.

Reference is now made to FIG. 4A where address pin 404 receives an address for reading data from or writing data to the non-volatile memory 402. The write data pin 406 receives write data to write to the non-volatile memory 402. The read data pin 418 outputs read data from the non-volatile memory 402. The clock pin 408 receives a clock signal to time the read and write cycles of the non-volatile memory 402. The read/write pin 410 receives a read/write signal to indicate whether the cycle is a read cycle or a write cycle.

The RAS pin 412 receives a RAS signal to indicate that a RAS address is being transmitted over the address pin 404. The CAS pin 414 receives a CAS signal to indicate that a CAS address is being transmitted over the address pin 404. The RAS and CAS addresses may be used to indicate an address within the memory 402 using row and column addresses as they would be with a DRAM. The Dqs pin 416 receives a data clock signal that is activated when data is transmitted over the write data pin 406 or the read data pin 418.

Referring now to FIG. 4B, the shared data interface 450 interfaces with a non-volatile memory 452, which may include one or more resistivity-sensitive memory elements of the memory technology described above. The shared data interface 450 includes an address pin 454, a clock pin 456, a read/write select pin 458, a RAS pin 460, a CAS pin 462, a Dqs pin 464, and a read/write data pin 466. The shared data interface 450 is a shared data interface since the write data and read data signals are transmitted on the same pin, the read/write pin 466.

The address pin 454 receives an address for reading data from or writing data to the non-volatile memory 452. The clock pin 456 receives a clock signal to time the read and write cycles of the non-volatile memory 452. The read/write pin 458 receives a read/write signal to indicate whether the cycle is a read cycle or a write cycle. The read/write data pin 466 either transmits data during a read cycle or receives data during a write cycle.

The RAS pin 460 receives a RAS signal to indicate that a RAS address is being transmitted over the address pin 454. The CAS pin 462 receives a CAS signal to indicate that a CAS address is being transmitted over the address pin 454. The RAS and CAS addresses may be used to indicate an address within the non-volatile memory 452 using row and column addresses as they would be with a DRAM. The Dqs pin 464 receives a data clock signal that is activated when data is transmitted over the read/write data pin 466.

DRAM Read/Write Timing Diagrams

Figure 5A:
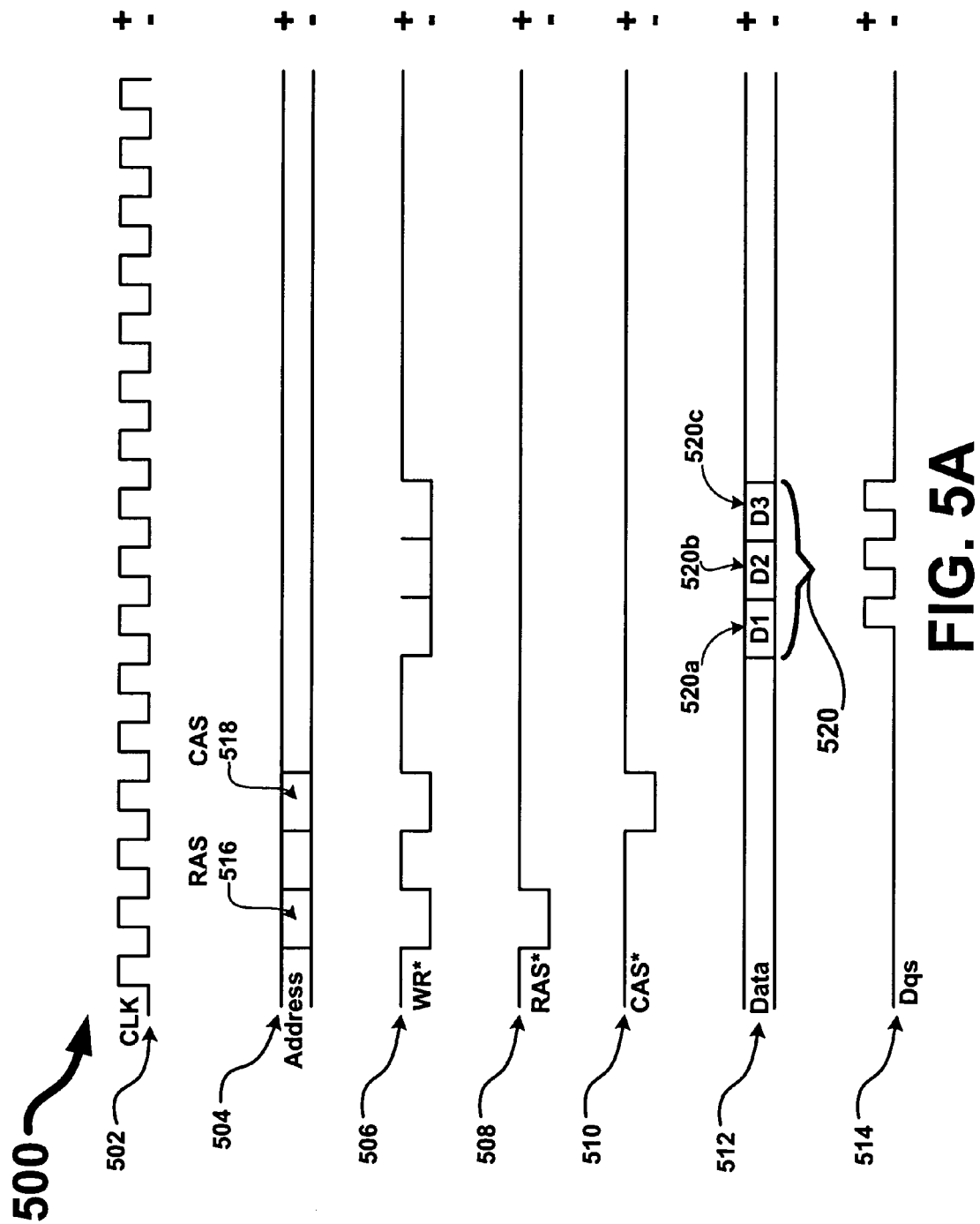
FIG. 5A depicts an exemplary write cycle timing diagram for a memory interface such as those depicted in FIGS. 4A and 4B.
Figure 5B:
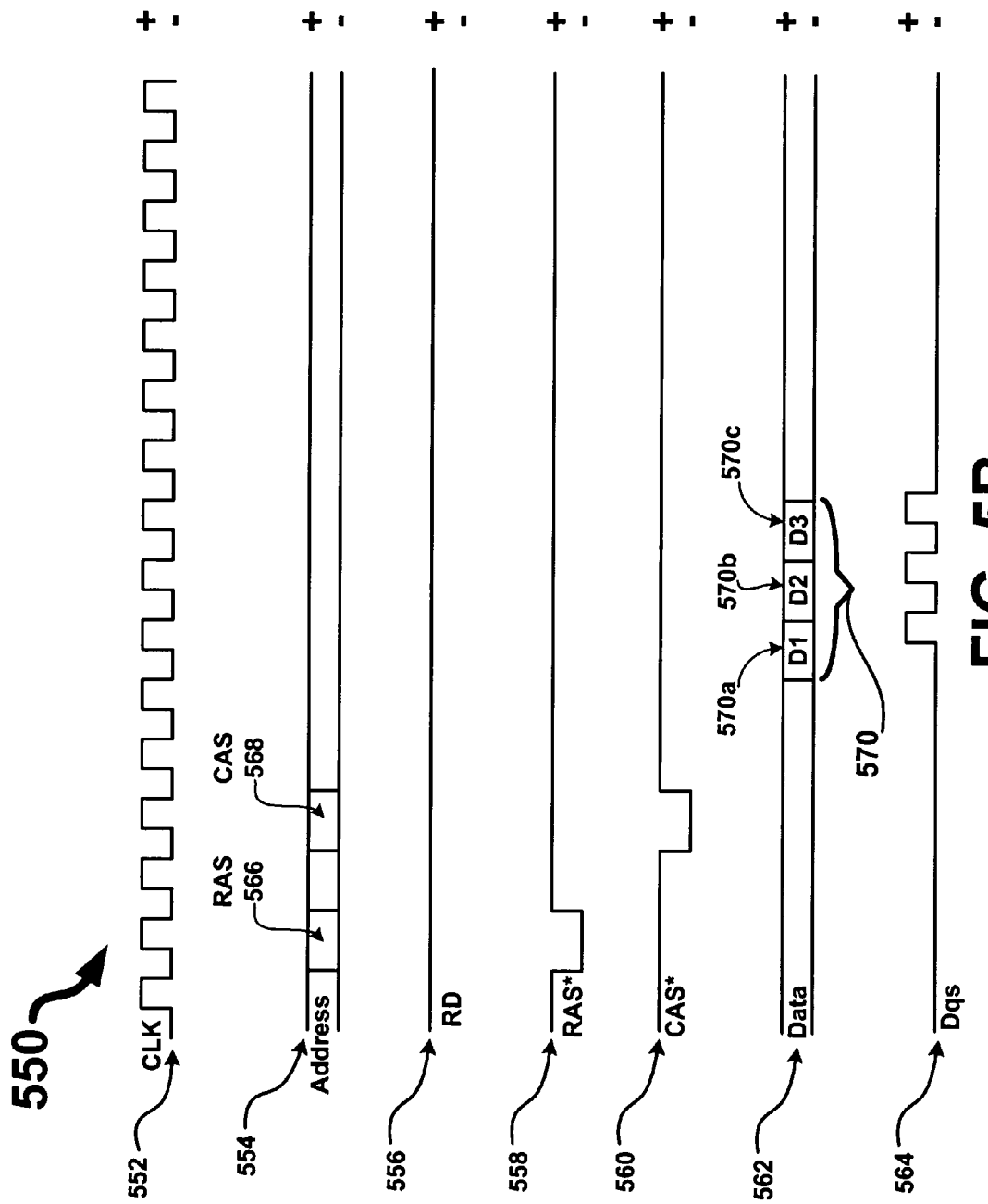
FIG. 5B depicts an exemplary read cycle timing diagram for a memory interface such as those depicted in FIGS. 4A and 4B.

FIGS. 5A and 5B depict diagrams for write and read cycles (respectively) using a memory interface such as those described above in regards to FIGS. 4A and 4B according to various examples. FIG. 5A depicts a timing diagram 500 for a write cycle using an interface such as one of the interfaces 400 or 450. FIG. 5B depicts a timing diagram 550 for a read cycle using an interface such as one of the interfaces 400 or 450. The timing diagrams 500 and 550 depict, for example, the signals at the pins 404-418 or 454-466 over time according to various examples.

Referring now to FIG. 5A, timing diagram 500 includes several signals. A clock signal 502 may be the signal at one of the clock pins 408 or 456. A write signal 506 may be the signal at on of the read/write pins 410 or 458. A RAS signal 508 may be the signal at one of the RAS pins 412 or 460. A CAS signal 510 may be the signal at one of the CAS pins 414 or 462. A data signal 512 may be the signal at one of the write data pin 406 or the shared read/write data pin 466. The Dqs signal 514 may be the signal at one of the Dqs pins 416 or 464.

The clock signal 502 alternates between high and low according to a system clock. The clock signal 502 may be used to time write cycles. The address signal 504 may include two components: a RAS address 516 and a CAS address 518. The combination of the RAS address 516 and the CAS address 518 may be used to determine a location in a memory to write data. The RAS signal 508 goes low when the RAS address 516 is transmitted, and the CAS signal 510 goes low when the CAS address 518 is transmitted. Additionally, the write signal 506 also goes low during the transmission of the RAS and CAS addresses 516 and 518 to indicate that a write operation is taking place.

Data being written to the memory is transmitted over the data signal 514. The data signal 514 may transmit, for example, three packets 520 of data D1, D2, and D3 (denoted as 520a, 520b, and 520c respectively). During the transmission of the packets 520, the write signal 506 goes low to indicate that a write operation is occurring, and the Dqs signal 514 begins transmitting (e.g., alternating between low and high) to time the transmission of the packets 520.

A write may be performed using a device having a host configured to operate a DRAM, for example. The host may generate the signals 502-514 and transmit them to one of the interfaces 400 or 450. The interfaces 400 or 450 may then, for example, use the write circuitry 100 to write data to the various individual memory elements being accessed.

Reference is now made to FIG. 5B where timing diagram 550 includes several signals: a clock signal 552, an address signal 554, a read signal 556, a RAS signal 558, a CAS signal 560, a data signal 562, and a Dqs signal 564. The clock signal 552 may be the signal at one of the clock pins 408 or 456. The read signal 556 may be the signal at on of the read/write pins 410 or 458. The RAS signal 558 may be the signal at one of the RAS pins 412 or 460. The CAS signal 560 may be the signal at one of the CAS pins 414 or 462. A data signal 562 may be the signal at the write data pin 406 or the shared read/write data pin 466. The Dqs signal 564 may be the signal at one of the Dqs pins 416 or 464.

When a read cycle begins, the read signal 556 stays high to indicate that the memory is to remain ready for a read. The RAS signal 558 goes low to indicate that a RAS address 566 is being transmitted using the address signal 554. The CAS signal 560 then goes low to indicate that a CAS address 568 is being transmitted using the address signal 554. The RAS address 566 and the CAS address 568 may be used to determine a location in the memory to read data from.

After determining the address to read data from, three packets 570 of data D1, D2, and D3 (denoted as 570a, 570b, and 570c respectively) are transmitted using the data signal 562. The Dqs signal 564 may be used to time the transmission of the data packets 570. As shown here, multiple reads may be made in sequence.

A read may be performed using a device having a host configured to operate a DRAM, for example. The host may generate the signals 552-564 and transmit them to one of the interfaces 400 or 450. The interfaces 400 or 450 may then, for example, use the read circuitry 150 to read stored data from the various individual memory elements being accessed.

Vertically Configured Memories

FIGS. 6A through 6D depict vertical memory configurations according to various examples. According to an example, the memory technology described above may be configured so that an integrated circuit (IC) including memory of the memory technology and other semiconductor devices may be arranged into multiple vertically configured planes. For example, logic may be located in the base wafer (e.g., a silicon wafer) and arrays of two-terminal memory elements may be stacked in layers (planes) above the logic. One or more of the planes may be sub-divided to allow multiple memory arrays in the same plane.

An IC may be configured so that logic comprising transistors and other semiconductor devices, such as the logic used to access the memory (i.e., the memory logic), multiplexers, inverters, buffers, and other devices are formed on a semiconductor substrate located in a base (or bottom) logic plane. For example, the interfaces 100, 150, 200, 250, 400, and 450 may be incorporated in the logic plane. The non-volatile memory may then be formed above the logic plane in one or more vertically configured planes. Using these vertical configurations significantly reduces the footprint of an IC created with this memory technology. Additionally, according to another example, a portion of the memory may be located in the logic plane.

Figure 6A:
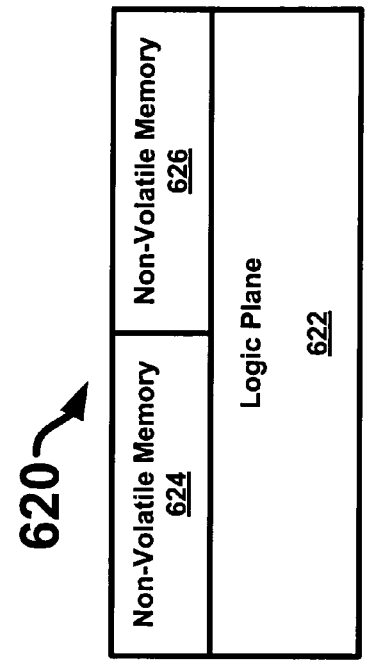
FIG. 6A depicts an exemplary configuration of a non-volatile memory positioned over a logic plane.

Referring now to FIG. 6A, an IC 600 includes a single plane of memory according to an example. The IC 600 includes a logic plane 602 and memory plane 604 vertically positioned over the logic plane 602. The logic plane 602, as mentioned above, includes semiconductor devices used to control the memory in the memory plane 604 (i.e., the memory logic), as well as other logic or memories that are not implemented in the memory plane 604. The memory logic may include interfaces such as the interfaces 100, 150, 200, 250, 400, and/or 450. The memory plane 604 includes memory of the memory technology described above such as a memory comprising a resistivity-sensitive memory element (e.g., a two-terminal memory element). The memory plane 604 may be connected to the logic plane 602 using various interconnects structures such as a via which may be formed in the logic plane 602 prior to deposition of the memory plane 604.

Figure 6B:
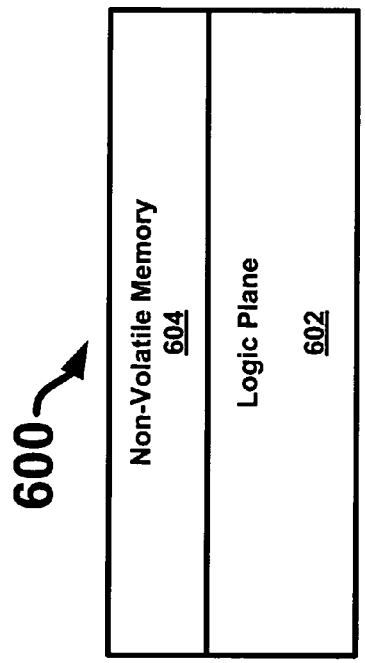
FIG. 6B depicts an exemplary vertically stacked non-volatile memory configuration positioned over a logic plane.

Reference is now made to FIG. 6B where an IC 610 includes two vertically stacked planes of memory. The IC includes a logic plane 612, a first memory plane 614 vertically positioned over the logic plane 612, and a second memory plane 616 vertically stacked above the first memory plane 614. The IC 610 can be used, for example, where two separate non-volatile memories are used. For example, the IC 610 may be used to emulate both SRAM and DRAM memories. Using this example, the first memory plane 614 may be used to emulate a SRAM and the second memory plane 616 may be used to emulate a DRAM. A SRAM interface and a DRAM interface may be in the logic plane 612. Alternatively, multiple planes of memory may be used to increase the memory capacity of an IC while using a smaller footprint than would be possible if two separate IC's were used. For example, the IC 610 may store 64 gigabytes of data with the first memory plane 614 having a data storage capacity of 32 gigabytes and the second memory plane 616 having a data storage capacity of 32 gigabytes.

Figure 6C:
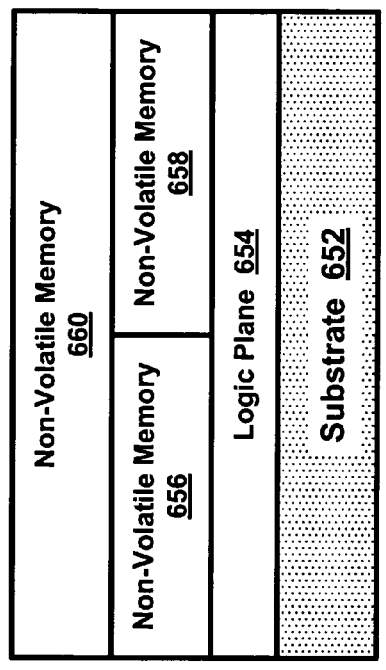
FIG. 6C depicts another exemplary configuration of a plurality of non-volatile memories positioned over a logic plane.

In FIG. 6C, an IC 620 includes two horizontally configured memories according to an example. The IC 620 includes a logic plane 622 and two memory planes 624 and 626 that are positioned adjacent to each other and vertically positioned over the logic plane 622. The IC 620 may be used, for example, when two types of memories are to be emulated using a single IC. For example, a DRAM and a SRAM may both be emulated using the IC 620 with memory plane 624 emulating DRAM and memory plane 626 emulating SRAM. Here, the memory plane 624 is located adjacent to the memory plane 626 in the same vertical plane.

Figure 6D:
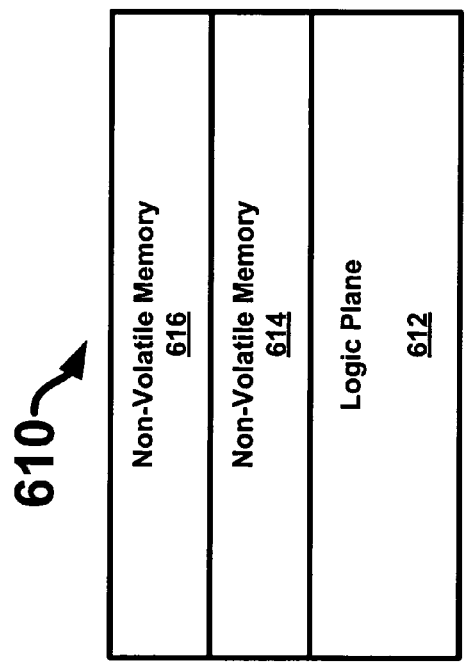
FIG. 6D depicts yet another exemplary configuration of a plurality of non-volatile memories positioned over a logic plane that is formed on a substrate.

Referring now to FIG. 6D, an IC 650 includes a substrate 652 on which a logic plane 654 is fabricated. The substrate 652 can be a silicon (Si) wafer and the logic plane 654 may include CMOS circuitry that is fabricated on the substrate 652, for example. A first vertical plane of memory includes memory planes 656 and 658 which are adjacent to each other and vertically positioned over the logic plane 654. A second vertical plane of memory includes a memory plane 660 that is vertically stacked above memory planes 656 and 658. The three memory planes 656, 658, and 660 can be used to emulate a combination of memory types, such as DRAM, SRAM, and FLASH, for example.

Although not depicted in FIGS. 6A through 6C, the logic planes 602, 612, and 622 may also be fabricated on a substrate, such as the substrate 652 depicted in FIG. 6D.

The logic plane may include circuitry operative to serve a non-memory related function such that some portion of the circuitry in the logic plane is dedicated to interfacing with and controlling data operations to the memory planes and some other portion of the circuitry in the logic plane is dedicated to some other function.

Figure 7:
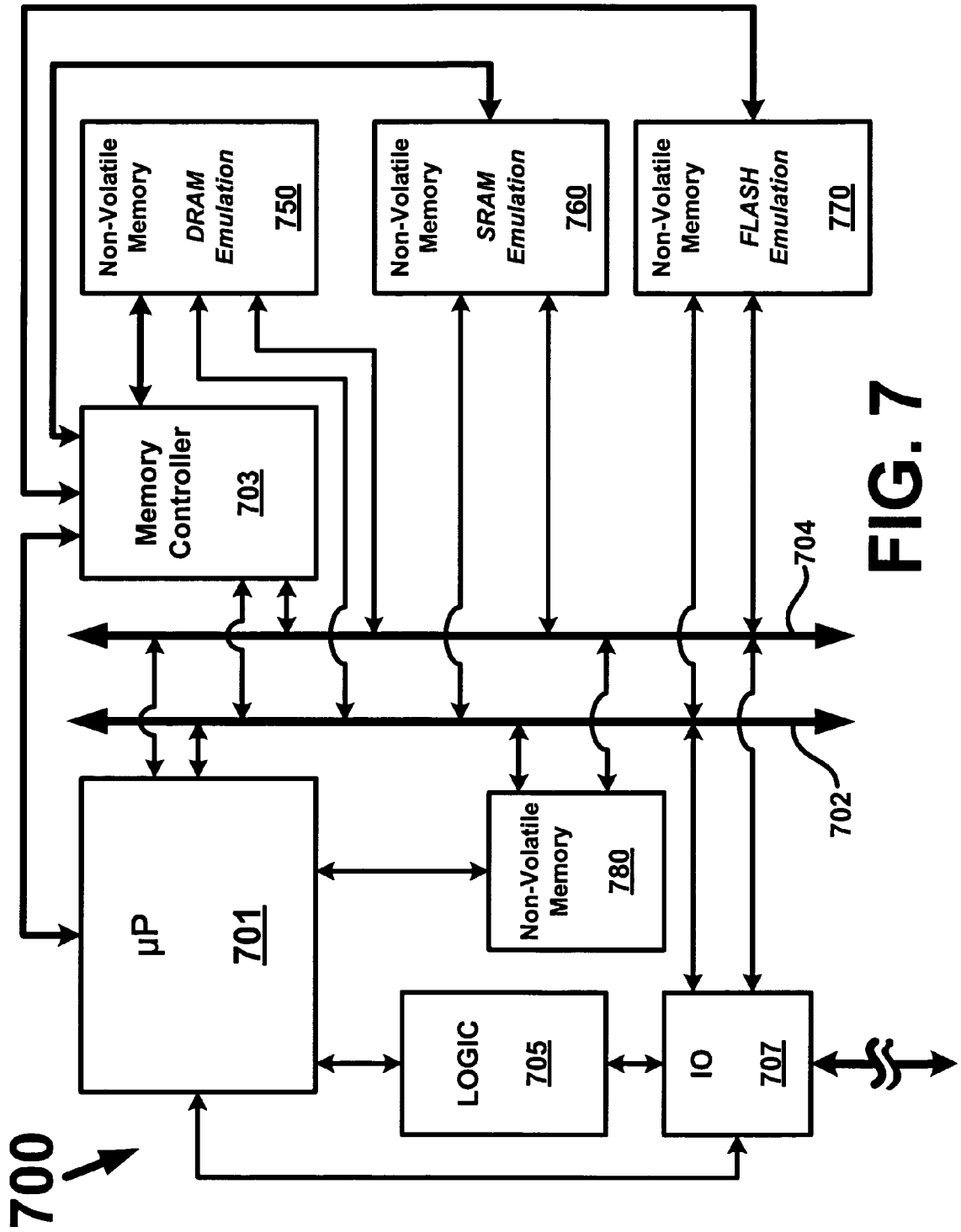
FIG. 7 depicts a system including a plurality of non-volatile memories, some of which emulate different memory types.

Turning now to FIG. 7, an exemplary system 700 includes a plurality of IC's that include the non-volatile resistivity sensitive memories as described above. The system 700 includes a microprocessor (μP) 701, a memory controller 703, a logic block 705, an input/output (IO) unit 707, an address bus 702 and a data bus 704. Although a microprocessor is depicted, the system 700 can include other types of control units such as a micro controller, a computer, or a digital signal processor (DSP), for example. The system includes IC's 750, 760, 770, and 780 that are electrically coupled with the address 702 and data 704 busses. Memory controller 703 is electrically coupled with the μP 701 and the IC's 750, 760, and 770. The memory controller 703 may include direct memory access (DMA) capability so that data operations with the IC's 750, 760, and 770 can be directly controlled by memory controller 703 without intervention by the μP 701. Logic block 705 may include circuitry necessary for operation of the system 700 and may be implemented in discrete circuits, discrete IC's, an application specific integrated circuit (ASIC), programmable logic, or a field programmable gate array (FPGA), for example. The IO unit 707 provides communication between the system 700 and external systems and may use a variety of communications means such as wireless, LAN, WLAN, infrared, USB, Bluetooth, and serial interfaces, just to name a few.

In the system 700, IC 750 replaces and emulates DRAM, IC 760 replaces and emulates SRAM, and IC 770 replaces and emulates FLASH memory. For example, IC 770 can replace and emulate FLASH memory internal to the system 700 or a removable FLASH memory card. The replacement of DRAM, SRAM, and FLASH memory types by IC's 750, 760, and 770 is transparent to the memory controller 703 and the other components of the system 700 because those IC's emulate their respective memory types in a manner that is electrically compatible with the requirements for data access to the emulated memory types. The IC's may be pin compatible with the respective memory types that they replace. For example, IC 760 may be pin compatible with a conventional SRAM device that it replaces so that IC 760 can be mounted to a PC board in the same slot normally configured to receive the conventional SRAM device. The IC's may conform to an industry standard for memory devices, such as JEDEC, for example. The number of IC's depicted may be reduced by implementing vertically stacked memories and/or horizontally adjacent memories as was described above in reference to FIGS. 6B through 6D. For example, a single IC can replace IC's 760 and 770 by vertically stacking a memory array for emulating FLASH above a memory array for emulating SRAM, with the logic plane including interface circuitry for both memory types. Other application specific combinations are possible, such as DRAM and SRAM emulation in a single IC using vertically stacked memory arrays and/or horizontally adjacent memory arrays.

IC 780 is not electrically coupled with the memory controller 703 and is instead electrically coupled with the µP 701. IC 780 may be used for a variety of data storage purposes. For example, IC 780 can be used as a scratch pad for µP 701. The interface circuitry in the logic plane of IC 780 can be configured to communicate with the µP 701 so that the µP 701 can perform data operations on the IC 780. As another example, IC 780 can be configured to replace and emulate a hard drive. The IC's 750, 760, 770, and 780 can be configured in a variety of ways including but not limited to the configurations depicted in FIGS. 6A through 6D.

It is understood that although specific vertical configurations are shown here that other configurations can be realized. For example, additional memory planes may be added either vertically or horizontally.

Although the foregoing examples have been described in some detail for purposes of clarity of understanding, the examples are not limited to the details provided. There are many alternative ways of implementing the examples. The disclosed examples are illustrative and not restrictive.

What is claimed is:

1. An electrical system including third dimension embedded non-FLASH non-volatile memory, comprising:
    a semiconductor substrate including circuitry fabricated on a logic plane of the semiconductor substrate, the circuitry including
        a control unit including FLASH emulation interface circuitry operative to electrically communicate with a plurality of signals configured for data operations to FLASH memory, the plurality of signals including an address signal and at least one data operation signal,
        an input/output (I/O) unit in electrical communication with the control unit and configured for electrical communication with an external system, the I/O unit operative to electrically communicate signals between the control unit and the external system,
        a data bus,
        an address bus,
        the data bus and the address bus are in electrical communication with the control unit and the I/O unit, and
        a logic block in electrical communication with the control unit and
        the I/O unit;
    a vertically configured memory plane in contact with and fabricated directly above the semiconductor substrate, the vertically configured memory plane is positioned over the logic plane;
    a non-volatile memory array embedded in the vertically configured memory plane and electrically coupled with the control unit, the non-volatile memory array configured for data storage use by the control unit, the non-volatile memory array including a plurality of two-terminal memory cells,
    each two-terminal memory cell including a first terminal and a second terminal and is operative to store data as a plurality of conductivity profiles that can be determined by applying a read voltage across the first and second terminals, the data is retained in the absence of electrical power, data is written by applying a write voltage across the first and second terminals, and a magnitude of the read voltage is less than a magnitude of the write voltage,
    wherein the FLASH emulation interface circuitry is operative to perform data operations on the non-volatile memory array in response to the plurality of signals and the data operations emulate FLASH memory data operations, and
    wherein the FLASH emulation interface circuitry is configured to perform a write operation to the non-volatile memory array without having to perform a FLASH erase operation prior to the write operation.

2. The electrical system of claim 1, wherein the semiconductor substrate comprises a silicon wafer.

3. The electrical system of claim 1, wherein the control unit is selected from the group consisting of a microprocessor (µP), a micro controller (µC), a computer, and a digital signal processor (DSP).

4. The electrical system of claim 1, wherein the non-volatile memory array comprises at least one two-terminal cross-point memory array.

5. The electrical system of claim 4, wherein each two-terminal cross-point memory array includes a plurality of substantially orthogonally oriented conductive array lines that are electrically coupled with the control unit and a plurality of two-terminal memory cells, each two-terminal memory cell is positioned between a cross-point of a pair of the substantially orthogonally oriented conductive array lines.

6. The electrical system of claim 1, wherein each two-terminal memory cell further comprises a non-volatile two-terminal memory element electrically in series with its first and second terminals, the non-volatile two-terminal memory element including
    a mixed ionic electronic conductor including mobile ions, and
    an electrolytic tunnel barrier in contact with and electrically in series with the mixed ionic electronic conductor, and
    wherein application of the write voltage is operative to transport the mobile ions and cause a change in a conductivity of the non-volatile two-terminal memory element, and the change in the conductivity is indicative of stored data written to the non-volatile two-terminal memory element by the application of the write voltage.

7. The electrical system of claim 6, wherein the write voltage comprises a programming voltage applied across the first and second terminals and operative to transport the mobile ions from the mixed valence conductive oxide to the electrolytic tunnel barrier and the change in the conductivity is indicative of data stored as a programmed state.

8. The electrical system of claim 6, wherein the write voltage comprises an erase voltage applied across the first and second terminals and operative to transport the mobile ions from the electrolytic tunnel barrier to the mixed valence conductive oxide and the change in the conductivity is indicative of data stored as an erased state.

9. An electrical system including third dimension embedded non-FLASH non-volatile memory, comprising:
- a semiconductor substrate including circuitry fabricated on a logic plane of the semiconductor substrate, the circuitry including
  - a data bus,
  - an address bus,
  - a control unit including FLASH emulation interface circuitry operative to electrically communicate with a first plurality of signals configured for data operations to FLASH memory, the first plurality of signals including a first address signal and at least one first data operation signal,
  - a memory controller electrically coupled with the control unit, the address bus, and the data bus,
  - an emulation interface circuitry operative to electrically communicate with a second plurality of signals configured for data operations to at least one non-FLASH memory type that is electrically coupled with the memory controller, the address bus, and the data bus, the second plurality of signals including a second address signal and at least one second data operation signal,
  - an input/output (I/O) unit in electrical communication with the control unit and configured for electrical communication with an external system, the I/O unit operative to electrically communicate signals between the control unit and the external system,
  - the data bus and the address bus are in electrical communication with the control unit and the I/O unit, and
  - a logic block in electrical communication with the control unit and the I/O unit;
- at least one vertically configured memory plane in contact with and fabricated directly above the semiconductor substrate, the at least one vertically configured memory plane is positioned over the logic plane;
- a plurality of non-volatile memory arrays embedded in the at least one vertically configured memory plane, each non-volatile memory array including a plurality of two-terminal memory cells, each two-terminal memory cell including a first terminal and a second terminal and is operative to store data as a plurality of conductivity profiles that can be determined by applying a read voltage across the first and second terminals, the data is retained in the absence of electrical power, data is written by applying a write voltage across the first and second terminals, and a magnitude of the read voltage is less than the a magnitude of the write voltage,
- a first one of the plurality of non-volatile memory arrays is electrically coupled with the control unit and is configured for data storage use by the control unit, wherein the FLASH emulation interface circuitry is operative to perform data operations on the first one of the plurality of non-volatile memory arrays in response to the first plurality of signals and the data operations emulate FLASH memory data operations, and wherein the FLASH emulation interface circuitry is configured to perform a write operation to the first one of the plurality of non-volatile memory arrays without having to perform a FLASH erase operation prior to the write operation; and
- at least one other of the plurality of non-volatile memory arrays is operative as the at least one non-FLASH memory type, the at least one other of the plurality of non-volatile memory arrays is electrically coupled with the memory controller, the address bus, and the data bus, and wherein the emulation interface circuitry is operative to perform data operations on the at least one other of the plurality of non-volatile memory arrays in response to the second plurality of signals and the data operations emulate memory data operations to the at least one non-FLASH memory type.

10. The electrical system of claim 9, wherein the at least one non-FLASH memory type comprises SRAM.

11. The electrical system of claim 9, wherein the at least one non-FLASH memory type comprises DRAM.

12. The electrical system of claim 9, wherein the at least one non-FLASH memory type comprises ROM.

13. The electrical system of claim 9, wherein the at least one non-FLASH memory type comprises a plurality of non-FLASH memory types selected from the group consisting of SRAM, DRAM, and ROM.

14. The electrical system of claim 9, wherein the at least one other of the plurality of non-volatile memory arrays is positioned in a different memory plane than the first one of the plurality of non-volatile memory arrays.

15. The electrical system of claim 9, wherein the at least one vertically configured memory plane includes a plurality of vertically stacked memory planes, each memory plane is in contact with an adjacent memory plane, and each memory plane including at least one of the plurality of non-volatile memory arrays.

16. The electrical system of claim 9, wherein the at least one vertically configured memory plane includes a plurality of non-volatile memory arrays that are positioned in the same memory plane and are positioned horizontally adjacent to one another.

17. The electrical system of claim 16, wherein the at least one vertically configured memory plane includes a plurality of vertically stacked memory planes with each memory plane in contact with an adjacent memory plane.

18. The electrical system of claim 9, wherein the plurality of non-volatile memory arrays comprises a plurality of two-terminal cross-point memory arrays.

19. The electrical system of claim 18, wherein each two-terminal cross-point memory array includes a plurality of substantially orthogonally oriented conductive array lines that are electrically coupled with at least a portion of the circuitry in the logic plane and a plurality of two-terminal memory cells, each two-terminal memory cell is positioned between a cross-point of a pair of the substantially orthogonally oriented conductive array lines.

20. The electrical system of claim 19, wherein each two-terminal memory cell further comprises a non-volatile two-terminal memory element electrically in series with its first and second terminals, the non-volatile two-terminal memory element including
  - a mixed ionic electronic conductor including mobile ions, and
  - an electrolytic tunnel barrier in contact with and electrically in series with the mixed ionic electronic conductor, and
  - wherein application of the write voltage is operative to transport the mobile ions and cause a change in a conductivity of the non-volatile two-terminal memory element, and the change in the conductivity is indicative of stored data written to the non-volatile two-terminal memory element by the application of the write voltage.

21. The electrical system of claim 20, wherein the write voltage comprises a programming voltage applied across the first and second terminals and operative to transport the mobile ions from the mixed valence conductive oxide to the electrolytic tunnel barrier and the change in the conductivity is indicative of data stored as a programmed state.

22. The electrical system of claim 20, wherein the write voltage comprises an erase voltage applied across the first and second terminals and operative to transport the mobile ions from the electrolytic tunnel barrier to the mixed valence conductive oxide and the change in the conductivity is indicative of data stored as an erased state.

23. The electrical system of claim 9, wherein the memory controller includes direct memory access (DMA) circuitry configured to perform the data operations on the at least one other of the plurality of non-volatile memory arrays without intervention by the control unit.

* * * * *